United States Patent

[11] 3,603,646

[72] Inventor Arkady Leoff
Poughkeepsie, N.Y.

[21] Appl. No. 5,454
[22] Filed Jan. 26, 1970
[45] Patented Sept. 7, 1971
[73] Assignee International Business Machines Corporation
Armonk, N.Y.

[54] SEMICONDUCTOR WAFER AIR SLIDE WITH CONTROLLED WAFER MOTION

10 Claims, 3 Drawing Figs.

[52] U.S. Cl. ..................................................... 302/29, 65/163, 65/182 A, 193/32, 193/40, 193/43 R, 214/1 BE, 271/46
[51] Int. Cl. ..................................................... B65g 51/02, B65g 53/04, B65g 53/20
[50] Field of Search ........................................ 65/163, 182 A; 193/32, 40, 43, 2; 214/1 BE; 221/9, 13; 271/46, 50; 302/2, 29, 31

[56] References Cited

UNITED STATES PATENTS

| | | | |
|---|---|---|---|
| 2,538,972 | 1/1951 | Magnani ........................ | 214/1 BE X |
| 3,081,886 | 3/1963 | Flexman et al. .............. | 214/1 BE |
| 3,190,460 | 6/1965 | Rubin ............................ | 214/1 BE |
| 3,355,166 | 11/1967 | Plumb ........................... | 271/45 |

*Primary Examiner*—Evon C. Blunk
*Assistant Examiner*—W. Scott Carson
*Attorney*—Sughrue, Rothwell, Mion, Zinn & Macpeak

ABSTRACT: A gravity-type air slide is provided with a series of spaced vacuum holds with a differential vacuum switch in the vacuum supply circuit allowing self-controlled feed of wafers sequentially from one vacuum hold to another along the slide. An inspection station comprising a revolving pedestal with a porous support surface may be placed adjacent to one of the vacuum holes and coupled selectively to positive air pressure or to vacuum pressure by a switch over valve which is also controlled by the differential vacuum switch. The wafer becomes part of the revolving pedestal and inspection is performed on it. Afterwards, the wafer is released from the pedestal and continues along the air slide path by gravity.

INVENTOR
ARKADY LEOFF

BY Sughrue, Rothwell, Mion, Zinn & Macpeak

ATTORNEYS

SEMICONDUCTOR WAFER AIR SLIDE WITH CONTROLLED WAFER MOTION

BACKGROUND OF THE INVENTION

1. Field of the Invention

This invention relates to article transport systems and more particularly to an air slide transport system in which semiconductor wafers sequentially slide along a porous surface on the air film under gravity influence.

2. Description of the Prior Art

Articles of various sizes have been transported from position to position or station to station by mechanically moving them in sequence along a transport path and over a porous surface to which is applied positive air pressure to create an air bearing or air cushion allowing movement of the articles in a frictionless manner. In particular, electronic semiconductor wafers of minute size, in the form of discs or plates, have been allowed to move along a transport system comprising an air slide wherein the porous surface supporting the moving semiconductor wafer is inclined, such that the wafer moves from the upper end to the lower end of the transport path purely by gravity effect. Where a great number of wafers move along the transport path in sequence, there has been considerable difficulty in properly controlling the sequential movement of the same.

SUMMARY OF THE INVENTION

This invention is directed to an improved gravity-type air slide allowing self-controlled spacing of a plurality of articles which are gravity fed along the transport path in sequential fashion. The improvement resides in the employment of at least one vacuum braking or hold member which lies in juxtaposition to the path of movement of the articles and means for applying vacuum pressure to the hold member to affect the rate of movement of each article as it encounters the hold member. When the moving article overlies the hold member, there is an increase in vacuum within the hold member. The invention further provides means automatically responsive to the increase in vacuum pressure for reducing the applied vacuum to the same to release the article and to allow continued movement of the article upon reduction of applied vacuum pressure.

Specifically, the transport path comprises an inclined porous surface to the underside of which is applied positive air pressure to create an air cushion to support a series of semiconductor wafers moving in sequence along said surface and supported by the air cushion. The vacuum hold members comprise open-ended vacuum tubes positioned adjacent to the path of movement of the wafers, preferably extending through the porous surface. Each vacuum tube is coupled to a vacuum source through a solenoid-operated vacuum control valve responsive to a differential vacuum-pressure-sensing switch. The differential pressure-sensing switch controls operation of the solenoid valve upon a wafer overlying the tube. The sudden increase in vacuum pressure within the tube operates the solenoid valve, cutting off the tube from the vacuum source and opens up the vacuum tube to the atmosphere. A timer or other delay means allows the solenoid to revert to its original position, again coupling the tube to the vacuum source after the wafer, which is released from the vacuum tube, continues along the transport path under gravity force.

In an alternate embodiment, a rotating pedestal forms a portion of the porous air slide surface and is normally subjected to positive air pressure. The revolving pedestal is preferably positioned adjacent a vacuum tube and to one side thereof in the path of wafer movement. The differential vacuum-pressure-sensing switch operates a solenoid switch over valve to change the positive air pressure to vacuum pressure, locking the wafer to the pedestal for a period of time and simultaneously releases the vacuum in the vacuum tube. Thereafter, the vacuum pressure in the pedestal changes again to positive air pressure. The wafer continues along its path of movement on the air slide under gravity effect, and finally vacuum pressure is again applied to the vacuum tube.

In yet another embodiment, a plurality of vacuum tubes extend through the porous air slide support surface at spaced positions along the path of movement of the wafer. A wafer, in overlying the upstream tube, is stopped by the increase in vacuum pressure within the tube which results in operation of the differential pressure vacuum switch which cuts off all vacuum tubes momentarily from the vacuum source allowing the wafer to move to the next downstream position defined by the succeeding vacuum tube. Upon reaching the second tube, the wafer is held at this position until a succeeding wafer encounters the upstream vacuum tube whereupon the second wafer creates an increase in vacuum pressure within the first vacuum tube again momentarily cutting off vacuum pressure to all of the tubes and allowing the first and second wafers to move to succeeding stop positions defined by the second and third vacuum tubes in the downstream direction.

DESCRIPTION OF PREFERRED EMBODIMENTS

Figures 1, 2:
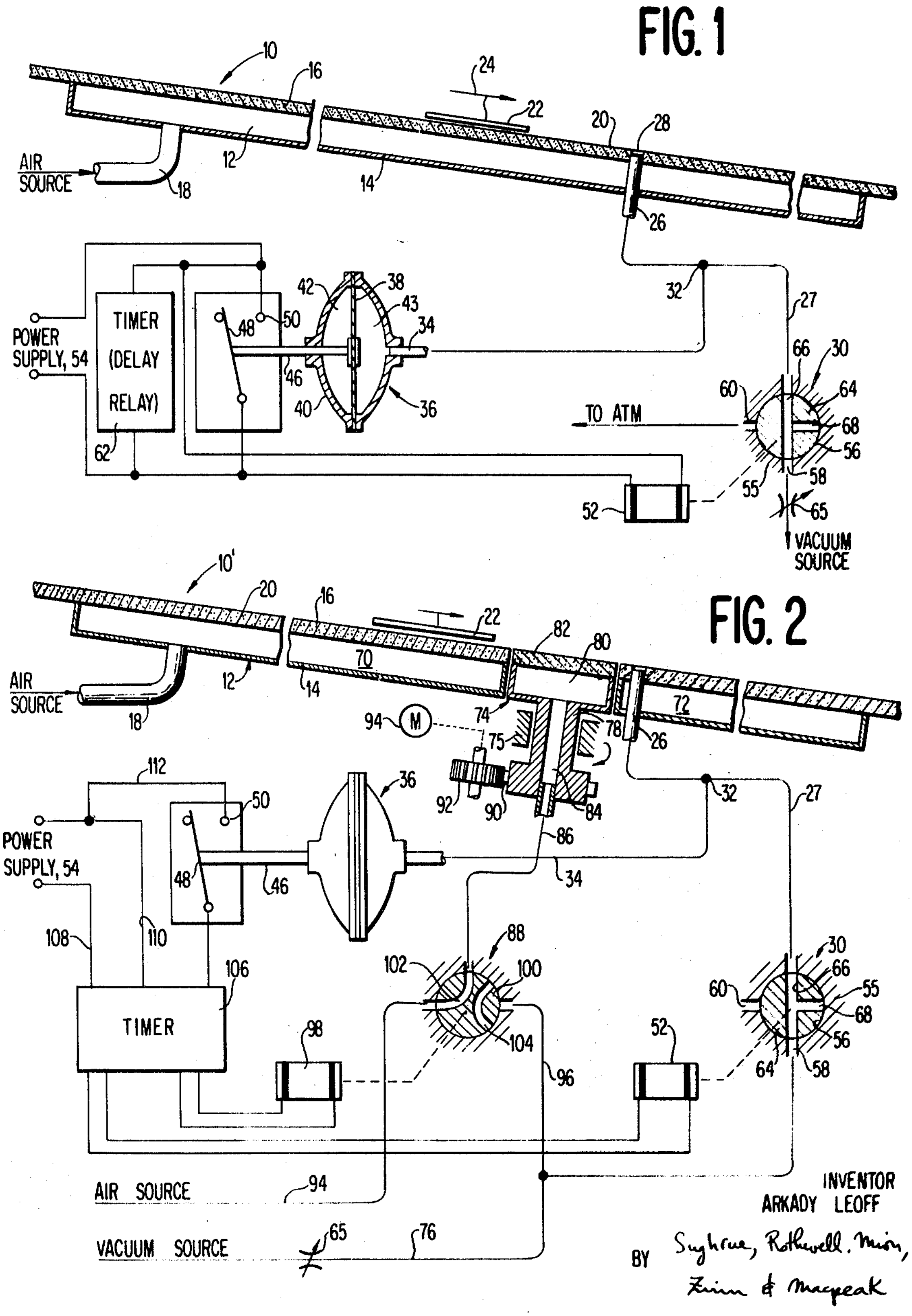
FIG. 1 is a schematic view of one embodiment of the semiconductor wafer air slide of the present invention providing self-controlled wafer motion.
FIG. 2 is a schematic view of a second embodiment of the present invention in which the wafer air slide includes a rotary vacuum pedestal.

Referring to FIG. 1 of the drawings, the embodiment of the invention illustrated in this Figure proposes a simple and inexpensive momentary stop and automatic release for semiconductor wafers or other articles moving in sequence along an air slide which defines a wafer transport system. The wafer transport system consists of an air slide 10 comprising a manifold 12 in the form of an imperforate casing 14 supporting a porous planar member or pavement 16 whose porosity is such that positive air pressure from an air source (not shown). As indicated by the arrow air enters the manifold 12 through a conduit 18 creating a film of air on the outer surface 20 of the porous member 16 which supports, in a frictionless manner, an article such as a wafer 22 which is moving over the same in the direction of arrow 24.

The present invention is directed to the means for momentarily stopping and automatic releasing of the wafer as it moves along the air slide under control of the wafer itself to properly maintain a plurality of wafers spaced along the path of movement, in this case, under the influence of gravity. The present invention has equal application to gravity fed or enclosed horizontal air drag type of air transport systems. In this respect, a vacuum tube 26, constituting a vacuum hold or braking member, is embedded into the porous member 16 of the air slide such that the open end 28 of the vacuum tube lies just beneath the surface 20 of the pavement or flush therewith. The vacuum tube 26 is connected to a vacuum source (not shown) as by a vacuum line 27, indicated by the arrow, through a solenoid-operated vacuum control valve 30. Further, a sensing line or tube 34 branches from the vacuum line 27 at 32 to connect the vacuum tube 26 to a differential vacuum-pressure-sensing switch 36. The vacuum-sensing switch 36 includes a flexible diaphragm 38 which divides casing 40 into a left-hand chamber 42 and a right-hand chamber 43. The right-hand chamber 43 senses the level of vacuum pressure within the vacuum tube 26. A slidable switch actuator rod 46 is coupled, at one end, to diaphragm 38 and at the other end to a movable switch contact 48. The natural resilience of the diaphragm 38 maintains the movable switch contact 48 away from stationary contact 50, but, upon the increase in vacuum pressure within vacuum tube 26 and the vacuum sensing switch chamber 43, the diaphragm 38 moves from its central position to the right, causing the movable switch contact 48 to close upon stationary contact 50. The normally open differential vacuum sensing switch 36 is connected to solenoid 52 and a power supply (not shown) through terminals 54 such that, upon closure of contacts 48 and 50, the solenoid 52 is energized to rotate solenoid valve 30 90° counterclockwise from the position shown. In this respect, the solenoid valve 30 is provided with a casing 55 having a circular recess 56, a through bore or passage 58 forming a portion of the vacuum line 27 and a right-angle passage 60 which is open to the atmosphere. The solenoid valve comprises a circular disc 64 carrying a through bore 66 and a right-angle passage 68 which intersects the same and extends from the center thereof to the periphery in one direction only. Upon energization of solenoid 52, the valve disc 64 rotates counterclockwise 90° to a position where the vacuum tube 26 is no longer coupled to the vacuum source through passage 58 of the valve casing but rather is connected through passages 66 and 68 within the valve disc 64 to right-angle passage 60 in the valve casing to the atmosphere. A variable restriction 65 is coupled between valve 30 and the vacuum source.

In operation, an ejected wafer 22 moves towards the vacuum intake opening 28 of vacuum tube 26, until the leading edge of the wafer covers the vacuum tube and is trapped by vacuum suction. As a result of the wafer overlying the open end 28 of vacuum tube 26, the vacuum within the tube builds up since the intake is obstructed, and also builds up within the sensing line 34. When the vacuum reaches a sufficient level, diaphragm 38 is deflected to the right due to the difference in pressure between chambers 42 and 43 causing the switch contacts 48 and 50 to close. With the sensing switch 36 actuated, power is supplied to the solenoid valve 52 of solenoid valve 30, rotating the valve disc 64 counterclockwise, thus cutting off the vacuum tube 26 from the source of vacuum. When bore or passage 68 of the valve disc 64 aligns itself with passage 58 of the valve casing, the relatively high vacuum pressure existing in lines 26 and 34 decreases since, passage 66 is now open to the atmosphere. Thus, the wafer 22, after being momentarily stopped, is automatically released by its own action and starts moving again. While the wafer moves over vacuum tube 26 and diaphragm 38 of the vacuum switch 36 is in initial condition due to absence of vacuum in sensing line 34 the solenoid valve 30 stays energized. This is achieved by use of time delay relay 62. It keeps line 26 free of vacuum while the wafer is moving over opening 28. When wafer completely clears the opening 28, the time delay relay deenergizes the solenoid 30 and it returns to state shown in FIG. 1. This may be achieved by a spring or other biasing means normally returning the disc to the position shown in the absence of energization of solenoid 52.

The system is again ready to accept the next wafer coming from the magazine (not shown) which moves toward vacuum tube 26 from the same direction as wafer 22. The system may advantageously function to reduce the speed of the previous wafer 22 to one that can be accepted in a storage or by next process step.

A second embodiment of the present invention is shown in FIG. 2. In this embodiment, like numerals identify like elements to the embodiment of FIG. 1. Again, the air slide 10′ comprises a manifold 12 defined by imperforate casing 14, in this case two sections defining manifold chambers 70 and 72. Each chamber is provided with a porous pavement 16 providing an upper support surface 20 through which passes air under pressure to define an air bearing or cushion for moving wafers, such as 22, which move in sequence across the inclined surface of the same, under the influence of gravity. Of course, the wafers may be forcibly driven across the surface of the same rather than by gravity feed. Positive pressure air is delivered from a source (not shown) through an inlet 18 to chambers 70 and 72 in like manner to the previous embodiment. Again, a vacuum tube 26 is embedded into the porous pavement 16 of the air slide, in this case behind a revolving pedestal 74, the vacuum line being connected to a vacuum source (not shown) via lines 27, 76 and restriction 65. The solenoid valve 30 includes solenoid 52 which is mechanically coupled to a valve disc 64 which fills a circular cavity 56 within the valve casing 55. The valve disc includes a through passage 66 and a right-angle passage 68 which leads from the point of intersection to the periphery on one side only. The valve casing includes an in-line passage 58 defining a portion of the vacuum lines 27 and 76 coupled to vacuum tube 26 and the valve casing includes right-angle port 60 which opens up to the atmosphere.

Again, a sensing line 34 is connected to the vacuum line 27 as at 32, such that the level of vacuum within the line 27 is at all times sensed by the differential vacuum-pressure-sensing switch 36. Again, the switch-actuating rod 46 is coupled to movable contact 48 of the normally open switch and, under the increase in vacuum pressure within the vacuum tube 26 and vacuum line 34, switch contacts 48 and 50 close to energize solenoid 52 of the solenoid-operated valve 30. Unlike the previous embodiment, the vacuum pedestal 74 is positioned to one side of the vacuum tube 26, in the path of the moving wafer 22 upstream of tube 26. When the leading edge of the wafer encounters the open end 28 of the vacuum tube 26, the vacuum pressure within the same stops the wafer in a position such that it overlies not only the open end of vacuum tube 26 but also the rotating pedestal 74. In this respect, the rotating pedestal is supported for rotation by means 75 and includes an imperforate casing 78 defining a fluid chamber 80 in conjunction with a planar porous member 82, similar to the porous pavement 16 of the air slide proper. A fluid passageway 84 connects the chamber 80 to a tube or conduit 86 leading to valve 88. An annular gear 90 is fixed to the periphery of valve casing 74 and is in mesh with a drive pinion 92 mechanically coupled to a motor 94, such that by energization of the motor 94, the pedestal 74 is continuously rotated about an inclined axis at right angles to the path of movement of wafer 22.

In addition to tube 18, positive air pressure is provided from an air source (not shown) via conduit or tube 94 to the switchover valve 88 along with vacuum through vacuum branch line 96. The switchover valve is also provided with a solenoid 98 which is mechanically coupled to the rotating valve disc 100 for rotation of the same between two 90° positions. With the solenoid 98 deenergized, the valve discs 100 occupies the position shown, in which case a fluid passage 102 within the valve disc directs positive air pressure within conduit 94 to tube 86 of the rotating pedestal. However, upon energization the switch over valve rotates 90° counterclockwise to cause a second curved passage 104 within the valve disc 100 to fluid connect vacuum source branch passage 96 to tube 86 of the vacuum pedestal applying vacuum pressure rather than positive fluid pressure to chamber 80. It is noted that the solenoid 98 of the switch over valve 88 is also connected to power supply 54 as is solenoid 52 of the vacuum control switch 30 for the vacuum tube 26 which constitutes a vacuum hold member for the moving wafer 22. There is also provided an electrical timer 106 (time delay relay) which is under control of the differential vacuum-pressure-sensing switch 36. The electrical supply and distribution system includes power supply 54 and connecting lines 108, 110 and 112.

In operation of the embodiment shown in FIG. 2, the pedestal 74 may, for instance, form part of an inspection station for momentarily stopping each wafer as it moves along the gravity path. A wafer, such as wafer 22, moves towards the rotating pedestal and then stops over the vacuum tube 26 which constitutes a hold member. Since the wafer overlies the open end 28 of the vacuum tube 26, it covers the vacuum intake and additional vacuum builds up in sensing line 34 in the identical manner to the embodiment in FIG. 1. This "higher vacuum" triggers the differential vacuum-pressure-sensing switch 36, closing the circuits including solenoids 98 and 52.

Energization of solenoid 98 rotates the switch disc 100 from the position shown to a right-angle position such that the positive air pressure within chamber 80 is replaced with a suitable vacuum pressure maintaining the wafer in contact with the outer surface of the porous element 82. Energization of solenoid 52 rotates the disc 64 so that vacuum in line 26 is relieved to atmosphere through passage 60 and vacuum hold on wafer is removed. Thus, the wafer 22 becomes a part of the revolving assembly and during rotation of the same, inspection is performed on the wafer 22. Such inspection may be visual or optical, depending on the requirements of the system. After inspection, the duration of which is determined by process requirement, the solenoids 52 and 98 revert to their original state.

Initially, upon closure of switch contacts 48 and 50 of the differential vacuum-pressure-sensing switch 36, the circuits to the solenoids 98 and 52 are completed through lines 108 and 112 of power supply 54 to the timer 106. However, subsequent to initial energization of the timer 106 through lines 108 and 112, energization of the solenoids is continued via lines 108 and 110 since switch contacts 48 and 50 connect the timer and supply 54 in parallel to line 112. Thus, upon energization of solenoid 52, rotation of valve disc 64 couples the vacuum line 26 to the atmosphere through passage 60 resulting in reduction of vacuum pressure within vacuum line 27, vacuum tube 26 and sensing passage 34, resulting in opening of valve contacts 48 and 50 which would normally deenergize solenoid 52 and 98 in the absence of timer 106. However, by this time, means (not shown) within timer 106 cause the solenoids 98 and 50 to remain energized via supply lines 108 and 110. Upon receiving the signal indicating end of inspection the timer 106 then operates sequentially to first deenergize solenoid 98, causing the switch over valve 88 to release vacuum pressure to chamber 80 and apply positive pressure. This releases the captured wafer 22 and allows it to continue along its path of movement from left to right and down the inclined air slide 10'. The wafer continues to move toward the reject or accept storage (not shown) downstream from the vacuum tube 26. The electrical timer 106 next deenergizes the vacuum valve solenoid 52, just after the wafer clears the area of vacuum tube 26, to reconnect vacuum line 27 to vacuum source via conduits 76 and the next wafer is ready to proceed toward the pedestal and inspection. The elements of the system are again in the position shown in FIG. 2.

Figure 3:
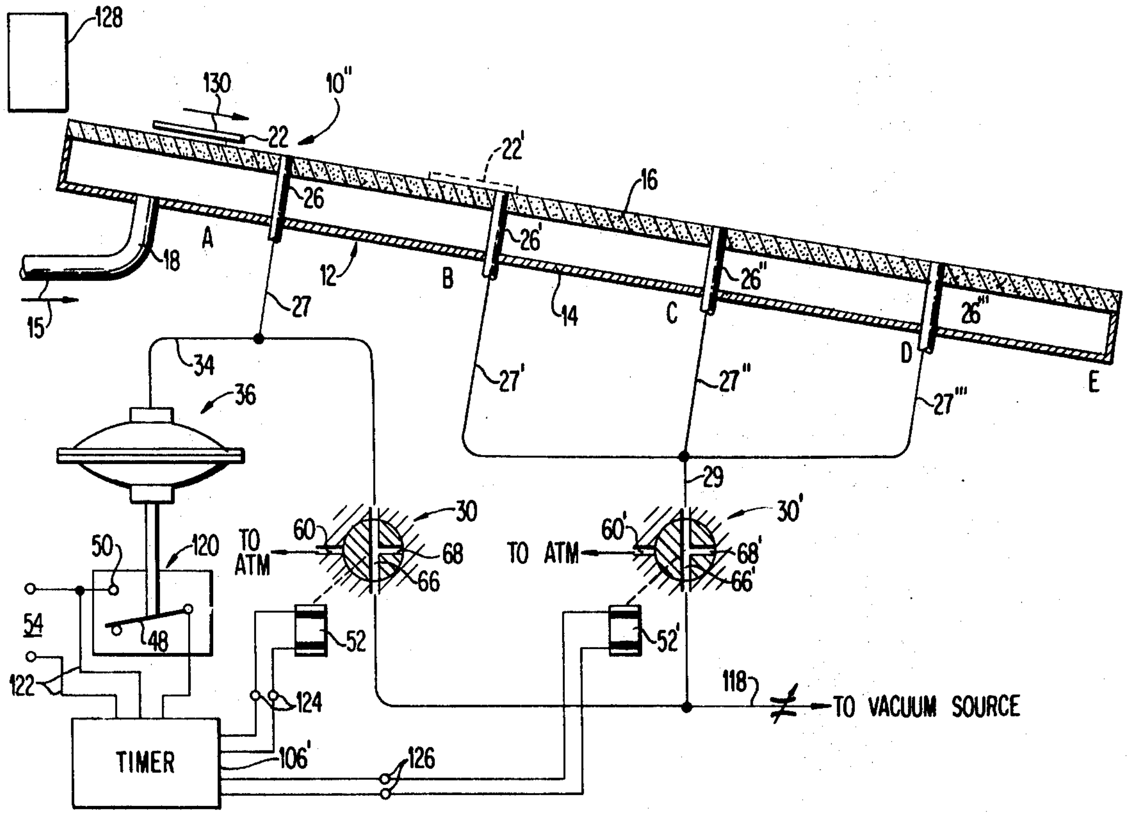
FIG. 3 is a schematic view of a third embodiment of the present invention involving a plurality of self-operating vacuum-braking members for controlling the sequential movement of a plurality of semiconductor wafers sliding thereon.

Turning to FIG. 3, there is shown a third embodiment of the present invention in which, again, like parts of the system have been given like reference numerals. In this respect the inclined, gravity-type air slide 10'' comprises a manifold 12 defined by an imperforate casing 14 and an overlying porous pavement 16 constituting a planer element of proper porosity. An inlet tube 18 coupled to the casing 14 allows air pressure as indicated by arrow 15 to enter the manifold chamber. The positive air pressure, in passing through porous pavement 16, creates an air bearing or cushion for the wafers such as wafer 22 sliding down the inclined outer surface 20 of the same, in the identical manner to the previous embodiments. In this embodiment, there is achieved both an easy and simple feed of wafers during their manufacture along a given path, the speed and pattern of feed is flexible and depends totally on wafer input. Through put of the feed slide 10'' is fast and does not depend on its length, since the time required for a wafer to travel from one vacuum hold position to the other is the through put time of the whole feed. Unlike the previous embodiments, the inclined air slide 10'' has several vacuum holds in the form of vacuum tubes embedded into the porous pavement 16. Thus, in addition to vacuum tube 26, there are provided in downstream order, vacuum tubes 26', 26'' and 26''' separated by distances in excess of wafer length. Vacuum tube 26 is again coupled via vacuum line 27 and solenoid-operated vacuum valve 30 to a vacuum source (not shown) via a common vacuum supply line 118. A differential vacuum pressure sensing switch 36 is coupled to vacuum line 27 through sensing line 34 in the identical manner to the previous embodiments. Further, the vacuum-pressure-sensing switch 36 is operatively coupled to the timer 106', the timer being connected to a suitable electrical source terminals 54 through leads 122. In addition, the downstream vacuum hold tubes or vacuum-braking members 26', 26'', and 26''' are coupled by a second solenoid-operated vacuum control valve 30' to the same vacuum supply line 118. In this respect, vacuum tube 26' is coupled via line 27' to line 29 carrying the solenoid operated valve 30' while vacuum hold tubes 26'' and 26''' are coupled to the same line via conduits 27'' and 27''' respectively. Solenoid-operated control valve 30, of course, includes through bore or passage 66 and a right-angle passage 68 extending from the intersection point to the periphery, on one side only, as in the previous embodiments, and solenoid operated valve 30' is likewise fashioned including through passage 66' and right angle passage 58'. The timer 106' is electrically connected to solenoids 52 and 52' of valves 30 and 30', respectively, through electrical leads 124 and 126. The various tubes 26, 26', 26'', and 26''' define hold or braking stations A, B, C, and D, respectively.

In operation, the vacuum hold at station A located on the wafer input end of the air slide 10'' controls the motion of all of the wafers in the slide. The wafers are advanced in steps from one vacuum hold to another as soon as a wafer is ejected onto a slide and reaches the first vacuum hold at station A. Assuming wafer 22 is ejected from wafer input station 128 onto slide 10'' at the upper edge, the wafer slides by gravity in the direction of arrow 130 until the leading edge of wafer 22 covers the vacuum intake of vacuum tube 26 and is momentarily trapped by the applied vacuum and held in this position. The differential vacuum build up is sensed by the vacuum-pressure-sensing switch 36 in the identical manner of the previous embodiment through sensing line 34. The closure of the switch contacts 48–50 energizes solenoid coils 52 and 52' of the two solenoid operated valves 30 and 30' respectively. The solenoid valves shut off the vacuum from vacuum source 118 to all of the vacuum holds, i.e., tubes 26, 26', 26'', and 26''' for a fraction of a second (controlled by the timer 106') and, since the valves rotate to the position where the vacuum pressure in lines 27 and 29 exhausts through vents 60 and 60', respectively, the wafer immediately leaves point A and moves towards station or point B. Meanwhile, the timer has returned the solenoid valves 30 and 30' to the position shown in FIG. 3 and vacuum pressure is again applied at all vacuum hold tubes simultaneously. The wafer, in advancing to point B, has its leading edge again encountering vacuum tube 26' and when it overlies the same, the applied vacuum will hold the wafer in this position, as indicated in dotted lines at 22'. The wafer 22' stays at this location until another wafer (not shown) is ejected onto the slide from wafer input 128 and reaches the first vacuum hold or brake at point A. Thus, the presence of the second wafer again shuts off the vacuum on all holds through operation of vacuum switch and timer 106'. The first wafer 22 now advances from hold station B to hold station C while the ejected wafer moves from A to B and stops at this station. The succeeding wafers repeat the sequence and all wafers advance to the next respective hold. Thus, a controlled wafer feed is established. The through put depends on demand and is controlled by wafers ejected onto the slide 10''. When a wafer is released from station D, it moves onto to wafer accept, for instance, at the end of the slide constituting station E.

What is claimed is:

1. In an article transport system including means for moving an article sequentially along a given path, at least one vacuum hold member in juxtaposition to said path of movement, and means for applying vacuum pressure to said hold member to affect the rate of movement of said article past said hold member, the improvement comprising: means responsive to an increase in vacuum within said hold member when said article overlies the same to automatically reduce the applied vacuum thereto whereby each article momentarily alters its speed during travel along said path when it encounters said hold member and is released therefrom for continued movement upon reduction of applied vacuum pressure thereto.

2. The article transport system as claimed in claim 1 wherein said means for moving articles sequentially along a given path comprises an inclined porous surface defining an air slide and means for applying positive air pressure thereto to create an air cushion, and said hold member comprises an open-ended vacuum tube carrying vacuum pressure, said open-ended vacuum tube projecting through said porous surface.

3. The article transport system as claimed in claim 2 wherein said means responsive to an increase in vacuum within said hold member to automatically reduce the applied vacuum thereto comprises a differential vacuum-pressure-sensing switch fluid connected to said open-ended tube, and a vacuum control valve operatively coupled between the source of vacuum and said tube and responsive to operation of said differential vacuum-pressure-sensing switch for cutting off said vacuum source from said tube and means for actuating said vacuum control valve after release of said article to reconnect said vacuum tube to said source of vacuum pressure.

4. The article transport system as claimed in claim 3 further including means for delaying the movement of said vacuum control valve from cutoff position to a position coupling said vacuum tube to said vacuum source.

5. The article transport system as claimed in claim 4 wherein said vacuum-sensing switch includes normally open switch contacts, and said system further includes a source of electrical power, and a solenoid for actuating said vacuum control valve whereby said vacuum-sensing switch couples said solenoid to said source of electrical power in response to an increase in applied vacuum within said vacuum tube.

6. The article transport system as claimed in claim 5 wherein said delay means includes an electrical timer operatively coupled between said vacuum-sensing switch and said solenoid for said vacuum control valve whereby said timer maintains said vacuum control valve in cut off position until said wafer completely passes said hold station after release due to momentary reduction in vacuum pressure within said hold tube.

7. The article transport system as claimed in claim 2 further comprising a rotary pedestal positioned in the path of said moving wafers and to one side of said hold tube, said rotary pedestal includes a fluid chamber having a porous planar member overlying the same with its outer surface coplanar with said porous surface of said air slide, means for rotating said pedestal about an axis parallel to the axis of said hold tube, a switchover valve for selectively applying positive fluid pressure or vacuum pressure to said rotary pedestal and means for operatively coupling said switchover valve to said differential vacuum-pressure-sensing switch such that positive air pressure is normally maintained within said rotary pedestal until an article overlies the porous surface of said rotary pedestal and said adjacent vacuum hold member.

8. The article transport system as claimed in claim 7 further comprising a timer operatively coupled between said pressure differential vacuum pressure sensing switch, said switchover valve and said vacuum control valve for terminating the application of vacuum pressure to said rotary pedestal and then coupling said vacuum hold member to the source of vacuum pressure after some delay to prevent the application of high vacuum pressure to the hold member until after the released article has left the vicinity of the same.

9. The article transport system as claimed in claim 1 wherein a plurality of longitudinally spaced vacuum hold members are positioned along the path of movement of said article and said apparatus further includes means for applying vacuum pressure simultaneously to all of said hold members of sufficient magnitude to stop movement of articles at each location thereof, means operatively coupled to said first, upstream vacuum hold member for reducing the vacuum pressure to release articles held at each of said spaced vacuum hold members, and means for delaying the reapplication of vacuum pressure to all of said hold members whereby, each article moves from an upstream vacuum hold member to the next downstream hold member and is held thereby until a succeeding article reaches said first upstream hold member to automatically remove vacuum pressure therefrom.

10. The article transport system as claimed in claim 9 wherein: solenoid-operated vacuum control valves normally fluid couple each vacuum hold member to a source of vacuum, said first vacuum hold member is fluid coupled to a differential vacuum-pressure-sensing switch, and said system further includes a source of electrical power and a timer under control of said differential vacuum pressure switch for energizing said solenoid operated valve means whereby; said solenoid operated valves operate immediately upon an article overlying said first vacuum hold member to cut off said vacuum source from all of said hold members while said timer initiates a delay in movement of said solenoid operated valves from vacuum cutoff position to a position recoupling all of said hold vacuum members to said vacuum source to allow released articles to pass beyond the vacuum hold members immediately upstream of the same.